United States Patent [19]

Ohta et al.

[11] Patent Number: 5,187,327
[45] Date of Patent: Feb. 16, 1993

[54] SUPERCONDUCTING MAGNETIC SHIELD

[75] Inventors: Hiroshi Ohta, Wako; Masakazu Aono, Nerima; Kazuhiko Kato, Kumagaya; Kazutomo Hoshino, Ageo; Hidefusa Takahara, Chofu; Tomonobu Nakayama, Koshigaya; Eiichi Sudoh, Omuta, all of Japan

[73] Assignees: Mitsui Kinzoku Kogyo Kabushiki Kaisha, Tokyo; Rikagaku Kenkyusho, Saitama, both of Japan

[21] Appl. No.: 588,337

[22] Filed: Sep. 26, 1990

[30] Foreign Application Priority Data

Sep. 29, 1989 [JP] Japan .................................. 1-254711
Feb. 19, 1990 [JP] Japan .................................. 2-38108

[51] Int. Cl.⁵ ......................... H05K 9/00; H01L 39/00
[52] U.S. Cl. ................................ 174/35 R; 174/15.4; 505/1; 505/845
[58] Field of Search ........................... 324/248; 307/91; 174/15.4, 15.5, 125.1, 35 R, 35 MS; 505/1, 704, 812, 813, 846, 884, 885, 886, 887; 128/653 R, 653 A, 653 SC

[56] References Cited

U.S. PATENT DOCUMENTS 4,931,735 6/1990 Overweg et al. .................... 324/318
4,981,137 1/1991 Kondo et al. .................. 128/653 A Primary Examiner—Leo P. Picard
Assistant Examiner—Bot Ledynh
Attorney, Agent, or Firm—Stevens, Davis, Miller & Mosher

[57] ABSTRACT

This invention provides a superconducting magnetic shield and a magnetic shielding apparatus including the same, thereby accurately measuring an extremely weak magnetic field such as magnetoencephalographic waves by reducing the influence of magnetic field of the earth or magnetic noises.

2 Claims, 4 Drawing Sheets

SUPERCONDUCTING MAGNETIC SHIELD

BACKGROUND OF THE INVENTION

(1) Field of the Invention

This invention relates to a magnetic shield utilizing a superconducting phenomenon and, more particularly, to a magnetic shield in which a superconductor is composed of bismuth high temperature oxide superconductor for accurately measuring a magnetoencephalographic wave or other external alternating magnetic field to be measured.

(2) Description of the Prior Art

Magnetic shields generally have an active shield and a passive shield. The passive shield has a ferromagnetic shield and a superconducting shield known per se. The characteristics of the respective magnetic shields have features. (See "Cryogenic Engineering" written by Ogasahara, pages 135-147, Vol. 18, Nov. 4, 1978.)

Among the magnetic shields, the ferromagnetic shield eliminates introduction of a magnetic field into an inner space by shielding an external magnetic field by a ferromagnetic material such as, for example, a nickel iron alloy commercially available as Permalloy, trade name. On the other hand, the superconducting shield excludes an external magnetic field toward the exterior without shielding it in a superconductor to obviate the introduction of the magnetic field into the inner space, and its magnetic shielding effect is much larger than that of the ferromagnetic material. More specifically, the ferromagnetic shield has a limit due to the presence of a residual magnetization. A magnetic shield of a range exceeding the limit is expected by a superconducting magnetic shield. However, since the critical temperature Tc at which an electric resistance becomes zero, of an Nb metal superconductor of, for example, $Nb_3Sn$, $Nb_3Ge$, etc., is approximately 20K of cryogenic temperature, it is necessary to employ liquid helium as a refrigerant. Thus, construction of a magnetic shield has a barrier of its cost, and the superconducting shield is not yet realized except an extremely small field at present.

Recently, researches for trying an analysis of a mechanism of human brains, a headache, a diagnosis of brains, etc., have been activated by measurements in magnetic waves generated from the brains. Heretofore, searches in the interiors of human brains by MRI, positron CT, etc. have been clinically executed, but limited in its resolution, radioactive rays to be used, etc. Therefore, needs for detection of magnetoencephalographic waves themselves are abruptly raised.

However, the intensity of the magnetoencephalographic waves is $10^{-3}$ gauss, extremely weak, while the magnetic field of the earth or the terrestrial magnetism is as strong as 0.3 gauss. There are large magnetic noises generated from various electric devices and equipments in addition to the magnetic fields of the earth in the environment.

It is required for a magnetic sensor of high sensitivity and a magnetic shield for shielding the magnetic field of the earth and the magnetic noises under such circumstances to detect extremely weak magnetoencephalographic waves. To this end, a magnetic sensor or a superconducting magnetic shield called SQUID (superconducting quantum interference device) has been recently developed. However, since the superconducting magnetic shield necessitates expensive liquid helium as its refrigerant as described above, it is not yet realized.

The development of a practical superconducting magnetic shield is desired not only to detect an extremely weak signal of a biomagnetism but to protect Josephson elements, IC circuits against external magnetic noises as described above.

It is an object of the present invention to provide a superconducting magnetic shield or a magnetic shielding apparatus which can shield various external magnetic noises by using inexpensive liquid nitrogen without expensive refrigerant such as liquid helium, etc.

SUMMARY OF THE INVENTION

According to one aspect of the present invention, there is provided a superconducting magnetic shield comprising a bismuth high temperature oxide superconductor having a cylindrical or rectangular parallelepiped shape at least opened at one end thereof and $1 \times 10^{-5}$ or less of a magnetic shielding effect defined by the ratio of intensity of a magnetic field at 77K detected by a magnetic field detecting coil installed in said cylindrical or rectangular parallelepiped shield to intensity of a magnetic field at an ambient temperature when the ratio of bore/length is 1 or less and ah external alternating magnetic field is objective.

According to another aspect of the present invention, there is also provided a magnetic shielding apparatus comprising a bismuth high temperature oxide superconducting shield having a cylindrical or rectangular parallelepiped shape at least opened at one end thereof and 1 or more of ratio of bore/length, and a ferromagnetic material magnetic shield or Helmholz coil provided outside said superconducting shield, whereby a magnetic shielding effect defined by the ratio of intensity of a magnetic field at 77K detected by a magnetic field detecting coil installed in said cylindrical or rectangular parallelepiped shield to intensity of a magnetic field at an ambient temperature is $1 \times 10^{-3}$ or less when an external alternating magnetic field is objective.

DETAILED DESCRIPTION OF THE PREFERRED EMBODIMENTS

Figure 1:
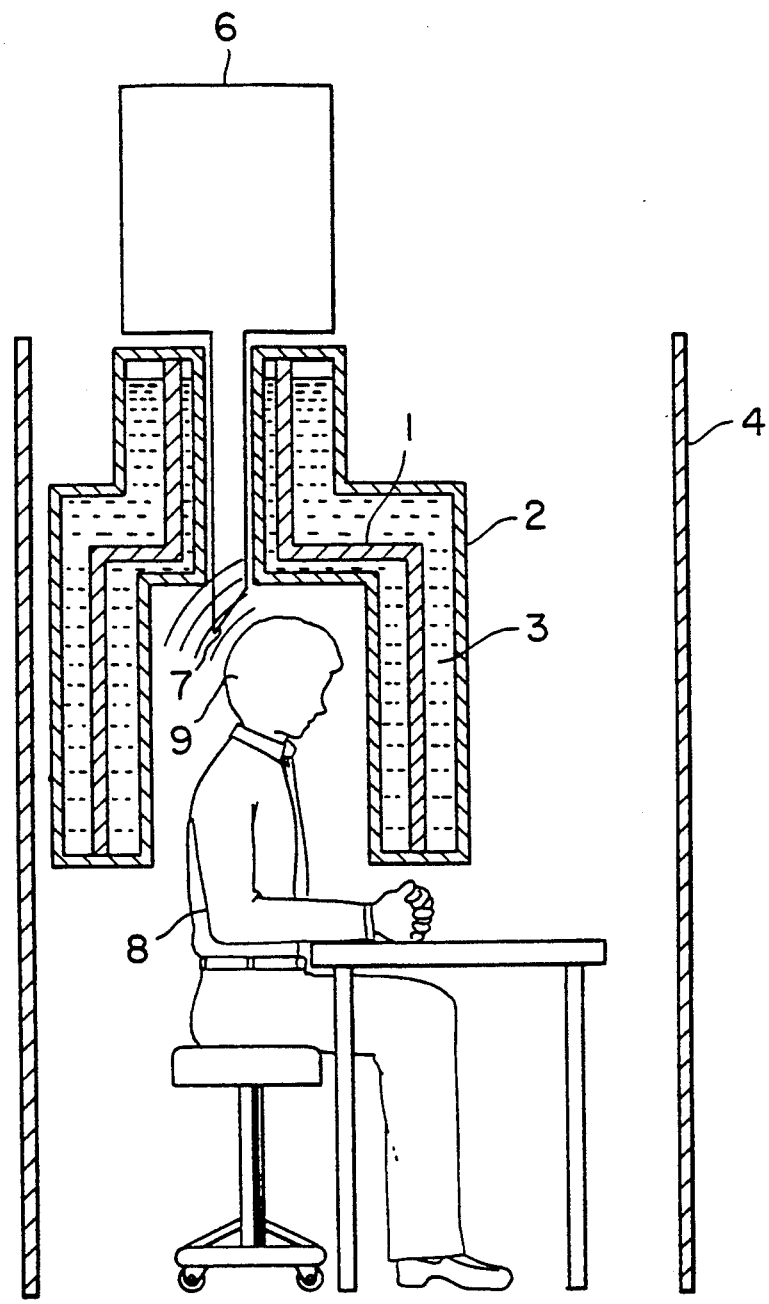
FIG. 1 is a schematic view showing a magnetic shielding apparatus used to detect an extremely weak magnetic field generated from a brain.

Typical high temperature oxide superconductors generally include various superconductors such as La-Sr-Cu-O, Bi-Sr-Ca-Cu-O, Y-Ba-Cu-O, Tl-Ba-Cu-O, etc. Among them, the La superconductors have Tc=30-40K, and hence liquid nitrogen cannot be employed as a refrigerant similarly to the Nb superconductors. The Tl superconductors have high Tc up to 125K, but have a problem in toxicity in its application. The high temperature oxide superconductors practically include Y and Bi superconductors. As a result that the present inventors have variously researched the Y and Bi high temperature superconductors, it has been found that the Bi oxide superconductor has superior properties to the Y oxide superconductor by forming the Bi oxide superconductor in a specific shape and exhibiting specific magnetic shielding effect. One reason is that the Bi high temperature oxide superconductor easily obtains a homogeneous superconducting phase due to the difference of oxygen sensitivity at the time of manufacture of the shield. If even a small amount of nonsuperconducting phase exists, lines of magnetic force are invaded therefrom to inhibit the effect of the magnetic shield. Another reason is considered that, since a Bi-O layer is easily slip-deformed in the Bi high temperature oxide superconductor, a stress at the time of manufacture is easily alleviated. It is also considered that the Bi oxide superconductor is stronger against water content than the Y oxide superconductor and has excellent aging stability.

The reason why the ratio of the bore/length of the shield is 1 or less in one aspect of the present invention is that it has small influence of invasion of magnetism from the open end to sufficiently shield the magnetic field of the earth and the magnetic noises without the necessity of other external magnetic shield. The reason why the one end is at least opened is that a SQUID as a sensor is inserted. Normally, the one end is closed in a vessel shape, but in order to measure magnetoencephalographic waves, etc., both ends are open, and a human head is inserted thereinto. Since the SQUID employs liquid helium, the size of its detector is increased, and a sufficiently large opening diameter is required. The diameter of the opening is reduced as much as possible as long as the above relation is satisfied.

The reason why the external alternating magnetic field is objective in the present invention is because magnetic fields such as those generated from a human brain is an alternating magnetic field having a frequency up to approximately 10 Hz. The SQUID serves to detect only the alternating magnetic field due to its mechanism. The SQUID is effective to detect magnetoencephalographic waves due to high sensitivity and the characteristic of the alternating magnetic field. If the SQUID also detects a DC magnetic field, it is necessary to shield the DC magnetic field of the magnetic shields, resulting in impossibility of detecting magnetoencephalographic waves from a noise. Therefore, even if the magnetic field of the earth exists, it is substantially a magnetostatic field, and therefore not a problem. A subject is fluctuations of the magnetic field of the earth. In order to detect magnetoencephalographic waves by suppressing the external alternating magnetic field represented by the fluctuations of the magnetic field of the earth, a SQUID having a gradiometer and performance of $10^{-5}$ or less of magnetic shielding effect are required. This performance cannot be satisfied by the ferromagnetic shield which merely has a shielding effect of $10^{-2}$ to $10^{-3}$.

Here, the magnetic shielding effect is defined as the ratio of the intensity of magnetic field at 77K ($-196°$C.) detected by a magnetic field detecting coil mounted in a cylindrical or rectangular parallelepiped shield to the intensity of magnetic field at an ambient temperature. In the present invention, the superconducting magnetic shield of the dimension and shape described above formed through steps of molding, cutting, sintering and coating from bismuth oxide powder having a composition such as, for example, $Bi_{1.8}Pb_{0.4}Sr_2Ca_2Cu_3O_y$ obtained, for example, by an oxalic acid-ethanol coprecipitation process to be described in detail later has $1 \times 10^{-5}$ or less of magnetic shielding effect defined as described above, thereby making it possible to detect low frequency, low magnetic field such as magnetoencephalographic waves having a frequency up to 10 Hz and $10^{-9}$ gauss.

According to another aspect of the present invention, there is provided a magnetic shielding apparatus comprising a bismuth high temperature oxide superconducting shield having a cylindrical or rectangular parallelepiped shape opened at least at one end thereof and 1 or more of ratio of bore/length, and a ferromagnetic material magnetic shield or Helmholz coil disposed outside the bismuth high temperature oxide superconducting shield. Even though the ratio of the bore/length is 1 or more and the influence of invasion of a magnetic field from the opened end is large, the ferromagnetic material magnetic shield or Helmholz coil is provided outside the superconducting magnetic field to reduce magnetic noises in so-called two stages, thereby making it possible to measure accurately an extremely weak magnetic field such as magnetoencephalographic waves.

When a magnetic field (up to $10^{-9}$ gauss) generated from a human brain is detected by a SQUID fluxmeter, the diameter (D) of the opening end of a high temperature oxide superconducting magnetic field is set to such a size that the head of a person to be a patient to be measured is easily inserted, and the length (L) of the shield is reduced to be smaller than the D. In this case, it is theoretically impossible to reduce the ratio Hi/Ho of the intensity Ho of an external alternating magnetic field to a magnetic field Hi in the shield to a value smaller than $5 \times 10^{-4}$. Therefore, this magnetic shield cannot detect magnetoencephalographic waves. In other words, with variations in the magnetic field of the earth being $0.3 \times 10^{-1}$ gauss sit cannot be reduced to be smaller than $0.3 \times 10^{-1} \times 5 \times 10^{-4} \times 10^{-4} = 1.5 \times 10^{-9}$ even by using a second-order gradiometer (assuming that a noise can be reduced by four figures). Since its signal has up to $10^{-9}$ gauss, its S/N ratio is not smaller than up to 1, and the signal cannot be detected in this state.

In the magnetic shield of the present invention, the diameter of the opening end thereof is not always the same over the entire length of the cylindrical or rectangular parallelepiped shape. The length necessary to preferably measure magnetoencephalographic waves by inserting a human head has a diameter to accommodate the head, but the other portion is reduced in diameter of the degree necessary to insert the end of a SQUID fluxmeter to desirably reduce the influence of magnetic noises as small as possible. In any case, the magnetic shield can be formed through the steps of pulverizing, molding and sintering.

Therefore, according to the present invention, a ferromagnetic material magnetic shield made of a ferromagnetic material such as, for example, Mumetal or a Helmholz coil is installed outside the high temperature oxide superconducting magnetic shield of cylindrical or rectangular parallelepiped shape having, a D/L of 1 or less as described above so as to cancel magnetic field noises. Here, the Mumetal is nickel-iron-copper alloy having high permeability and low hysteresis loss characteristics. The Helmholz coil is formed by disposing a pair of circular coils having equal radius and number of turns at a predetermined interval with respect to a common axis and connecting the circular coils in series with each other, thereby making it possible to obtain much more uniform magnetic field than the magnetic field made by a sole coil.

The direction of the cancelling coils is set to a direction for cancelling magnetic field noises to be invaded. External magnetic field can be reduced up to $10^{-2}$ to $10^{-3}$ or less by the ferromagnetic material magnetic shield or Helmholz coil. In this manner, the magnetic shielding apparatus has a value of $1 \times 10^5$ or less of magnetic shielding effect defined as described above. If a strong noise exists, it is preferable to employ the Helmholz coil. Assume that the magnetic noise of $10^{-3}$ can be reduced by the Mumetal, with the variations in the magnetic field of the earth being $0.3 \times 10^{-1}$, sufficient S/N ratio can be obtained for a signal up to $10^{-9}$ gauss by the level of $0.3 \times 10^{-1} \times 10^{-3} \times 5 \times 10^{-4} \times 10^{-4} = 1.5 \times 10^{-12}$ gauss.

Figure 2:
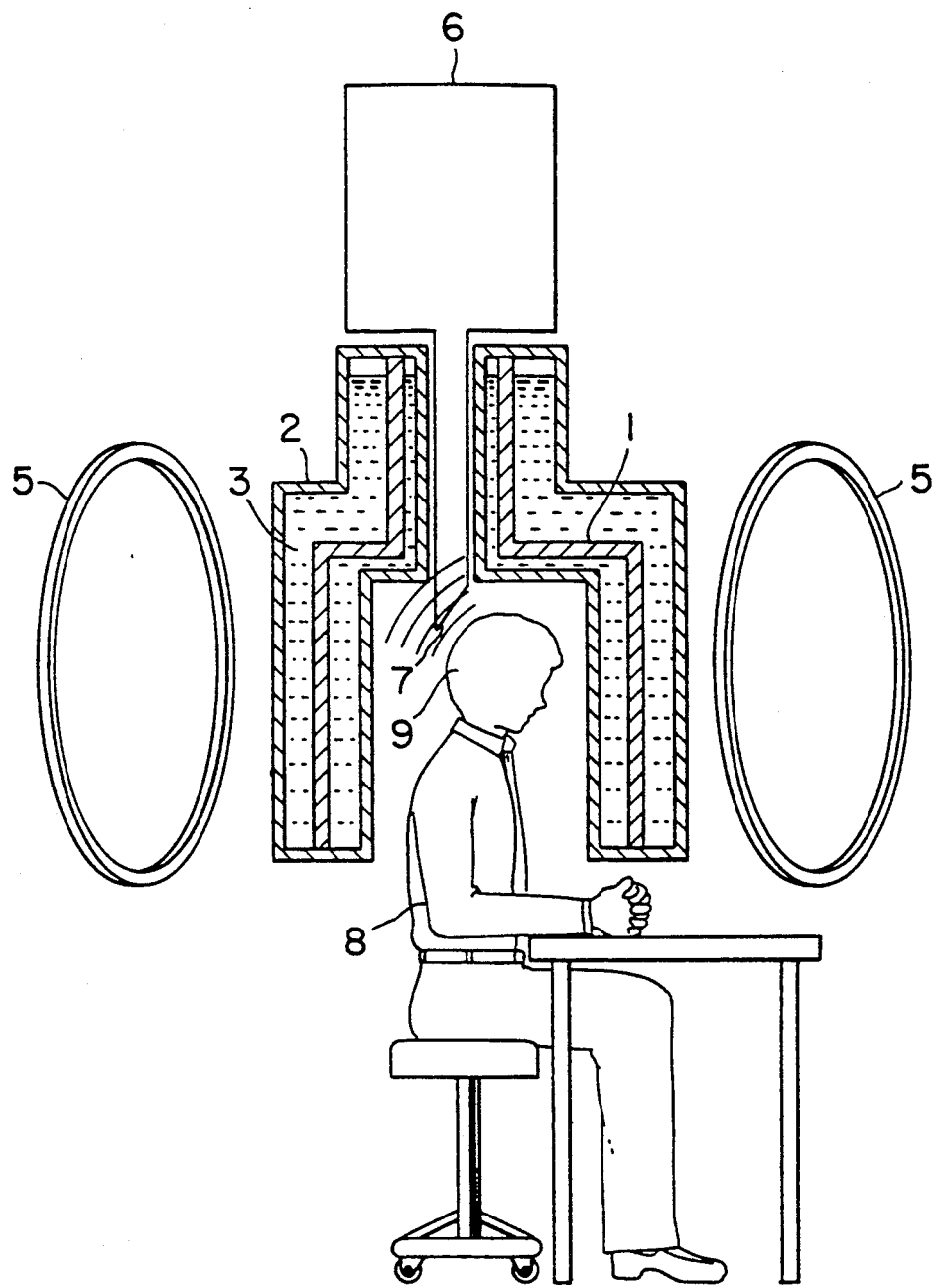
FIG. 2 is a schematic view showing a magnetic shielding apparatus of another example different from that in FIG. 1.

FIGS. 1 and 2 show concept view of the case of reducing magnetic noises at two stages and detecting an extremely weak magnetic field generated from a brain. FIG. 1 illustrates installation of a Mumetal cylinder as a ferromagnetic material magnetic shield, and FIG. 2 illustrates installation of a Helmholz coil.

In FIGS. 1 and 2, a superconducting magnetic shield 1 is formed in a cylindrical shape opened at both ends thereof. In the drawings, the diameter of the lower end of the superconducting magnetic shield 1 is formed to be larger, and the diameter of the upper end of the magnetic shield 1 is formed to be smaller. The magnetic shield 1 is covered with a heat insulating vessel 2 supported by suitable means, the vessel 2 having a shape and dimensions corresponding to the magnetic shield, and refrigerant, liquid nitrogen 3 is filled in the vessel 2.

On the exterior of the superconducting magnetic shield 2 formed as described above is disposed a cylindrical ferromagnetic material magnetic shield 4 made of a ferromagnetic material such as, for example, Mumetal to surround the periphery of the superconducting magnetic shield 1 (FIG. 1), or Helmholz coils 5 of a pair of coils having the same radius and number of turns are disposed at the same distance on the same axis through the magnetic shield 1 (FIG. 2).

A SQUID fluxmeter 6 is installed above the superconducting magnetic shield 1, and the end 7 thereof is extended into the opening above the superconducting magnetic shield 1.

A patient 8 to be measured for his magnetoencephalographic waves is located under the superconducting magnetic shield 1, and his head 9 is inserted into the lower opening of the magnetic shield 1. The end 7 of the SQUID fluxmeter 6 is approached to the head 9 of the patient 8 to measure the magnetoencephalographic wave on a head skin.

The SQUID is an ultrahigh sensitivity fluxmeter containing a Josephson element. Since the intensity of a magnetic field generated from a brain is extremely weak such as a level of $10^{-9}$ gauss, it cannot be measured except the SQUID fluxmeter. In order to detect the magnetoencephalographic waves, the following procedure is executed:

1) Liquid helium is transferred to the SQUID in an operating state.
2) The head of the SQUID is set to the head skin of the patient to be measured as near as possible.

This is because the distance attenuation of the magnetoencephalographic wave is avoided as much as possible.

3) A magnetic signal inputted to the Josephson element in the SQUID is detected as a voltage signal through electronics.
4) The above signal is integrated to form a magnetoencephalography (MEG).
5) A "reverse problem" is solved from the magnetoencephalography, and the generating position of the magnetic signal is fixed.

As described above, the generated magnetic signal can be detected in an extremely localized state.

It is necessary to avoid a mechanical vibration as much as possible in the procedure. Because the mechanical vibration disorders the magnetic signal. When the ferromagnetic Mumetal cylinder is employed as shown in FIG. 1, the magnetic shield may be, as required, box type to contain all of the patient to be measured, a fluxmeter, and a magnetic shield in the box. In this case, the magnetic shield is further completely performed, but designed in view of its cost performance.

A method of manufacturing the superconducting magnetic shield in a vessel shape according to the present invention comprises five steps of (1) manufacturing Bi high temperature oxide powder, (2) molding it by a cold hydrostatic press, (3) cutting it, (4) sintering it, and optionally, (5) coating the surface with resin. The steps of the manufacturing method will be described in detail.

(1) Manufacturing of powder

An oxalic acid-ethanol coprecipitating process improved from a known coprecipitating method as a wet powder manufacturing method is employed to coprecipitate the oxalate of Bi-Pb-Sr-Ca-Cu. The coprecipitated oxalate is filtered, dried and baked. In the baking step, bismuth high temperature oxide powder having a desired composition can be obtained by thermal decomposition. The size of the powder is in the order of submicron. The baking step is conducted at a temperature in a range of 800 to 850° C. to be set under optimum conditions of the desired composition. Pb is added to the powder. The Pb is known as an indispensable element to obtain so-called 110K phase in high volumetric rate in the Bi superconductor. The repetition of the baking steps is effective to exhibit high temperature to 110K phase, and a pressing step on the way is further effective thereto. As described above, the powder to be provided for the present invention intends to satisfy submicron size, content of 80 to 90% of up to 110K phase, homogeneity and high Tc phase.

(2) Pressing

In order to raise baking density, a cold hydrostatic pressing is employed. The Bi superconductor feasibly cracks at the baking time due to anisotropy of the Bi superconductor by uniaxial pressing. The pressing pressure is desirably 1 ton/cm$^2$ or more. Since the vessel is cylindrical, a core of rigidity is required at the pressing time. Therefore, a difference of molding densities between the outside and inside of the cylindrical vessel tends to occur. Since the difference of the densities causes the vessel to crack, the thickness in the vessel is limited in this respect.

(3) Cutting

Since a rubber mold is employed in the hydrostatic press, the surface of the vessel is uneven, and it is necessary to grind it in a desired size. In this case, it is considered that the influence is given on superconducting characteristics by applying a strain to the molded piece at the time of grinding. Therefore, it is necessary to reduce a cutout angle, a feeding speed as much as possible. Typically, the conditions are provided according to the following Table.

| A cutter with diamond tip is used to cut Spindle speed: 105 rpm | | |
| --- | --- | --- |
| | Feeding | Cutout amount |
| Bottom face | 0.175 mm/r | 0.5 mm |
| Rough finishing of outer periphery | 0.80 mm/r | 0.25–0.5 mm |
| Finishing | 0.20 m/r | 0.1 mm |

(4) Sintering

The sintering temperature is 800 to 850° C., and the optimum condition is determined depending upon the composition. The sintering time is typically 20 hours. The most important point for homogeneously sintering is to make temperature distribution in a furnace uniform. To this end, an electric furnace having a four face heater is preferable.

(5) Resin coating

The surface of the vessel is coated, as required, with silicone or varnish, etc.

As described above, the thickness of the vessel has a limit in view of pressing step and cutting step. In this meaning, it is preferable to set the thickness of the vessel to 1 mm or thicker. If the thickness of the vessel is less than 1 mm, the molded piece is impossible to be cut, and the sintered material has pores and it is accordingly necessary to enhance its surface density, and desired surface density cannot be obtained.

Examples will be described.

EXAMPLE 1

Powder was manufactured to obtain composition of $Bi_{1.8}Pb_{0.4}Sr_2Ca_2Cu_3O_y$ by an oxalic acid-ethanol coprecipitating process. The ratio of the ethanol to the entire liquid at the time of coprecipitation was set to 4. Thus, component metal ions can be all coprecipitated in a range of pH 3 to 6. It is sucked and filtered, then dried at two stages of 100° C. and 500° C., heat treated at 845° C. for 94 hours and pressed three times.

It is confirmed that almost all is obtained in so-called up to 110K phase by an X-ray diffraction pattern of the powder obtained as described above.

Then, the powder was cold hydrostatically pressed to mold a cylindrical vessel. The pressing pressure was 1.5 tons/cm$^2$, the diameter of a core was 45 mm, the diameter of the opening of the molded piece was 46 mm, the length was 60 mm (bore/length = 0.77), and the thickness was 2 mm. The thickness of 2 mm was adjusted by cutting.

This molded piece was baked at 845° C. for 20 hours, and sintered. In the case of the Bi oxide superconductor, almost no shrinkage upon baking was confirmed.

In order to check whether the manufactured vessel was cracked or not at the time of manufacturing, it was observed via an X-ray transmission photograph. As a result, it is confirmed that no crack occurred. The sintered vessel was coated with silicone, further wound with a Teflon tape, and the magnetic shielding effect was measured. The measuring device is shown in FIG. 3.

The cylindrical superconducting magnetic shielding vessel 11 is laid down laterally, a detecting coil 13 is provided in a ceramic powder 12, and an exciting coil 14 and a reference coil 15 are disposed adjacently outside the detecting coil 13. A bath of liquid nitrogen 16 is filled outside the ceramic powder bath 12, and an FET amplifier 17 is disposed therein. In order to prevent the high temperature superconductor vessel from cracking upon cooling to cool the superconductor vessel to a liquid nitrogen temperature, the vessel is not directly dipped in the liquid nitrogen, but indirectly cooled through ceramic (alumina) powder.

In the measurements, the ferromagnetic material magnetic shielding effect can be known in a state that the liquid nitrogen is not poured (in which state the superconductor vessel is not in a superconducting state), An alternating magnetic field was generated by an exciting coil 14, a signal detected by the detecting coil 13 was supplied to a lock-in amplifier (not shown) through the FET amplifier 17, and the exciting voltage was measured by using a signal from the reference coil 15.

Figure 3:
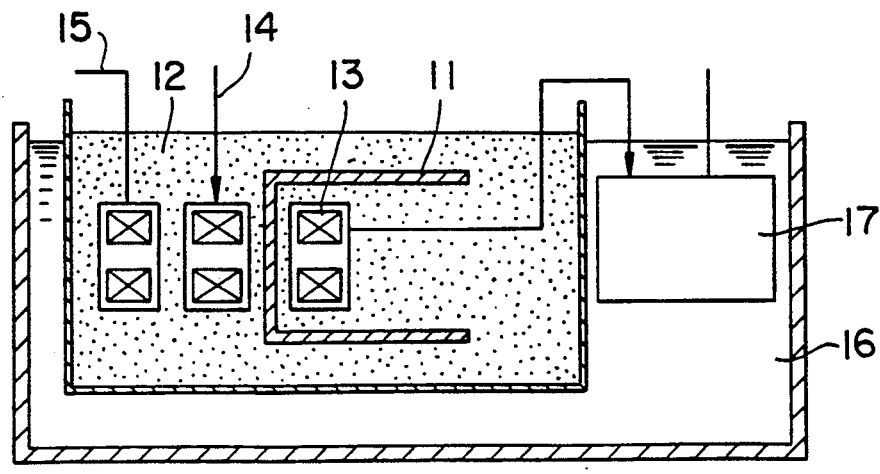
FIG. 3 is a schematic explanatory view showing a measurement system using a magnetic shield of an embodiment according to the present invention.
Figure 5:
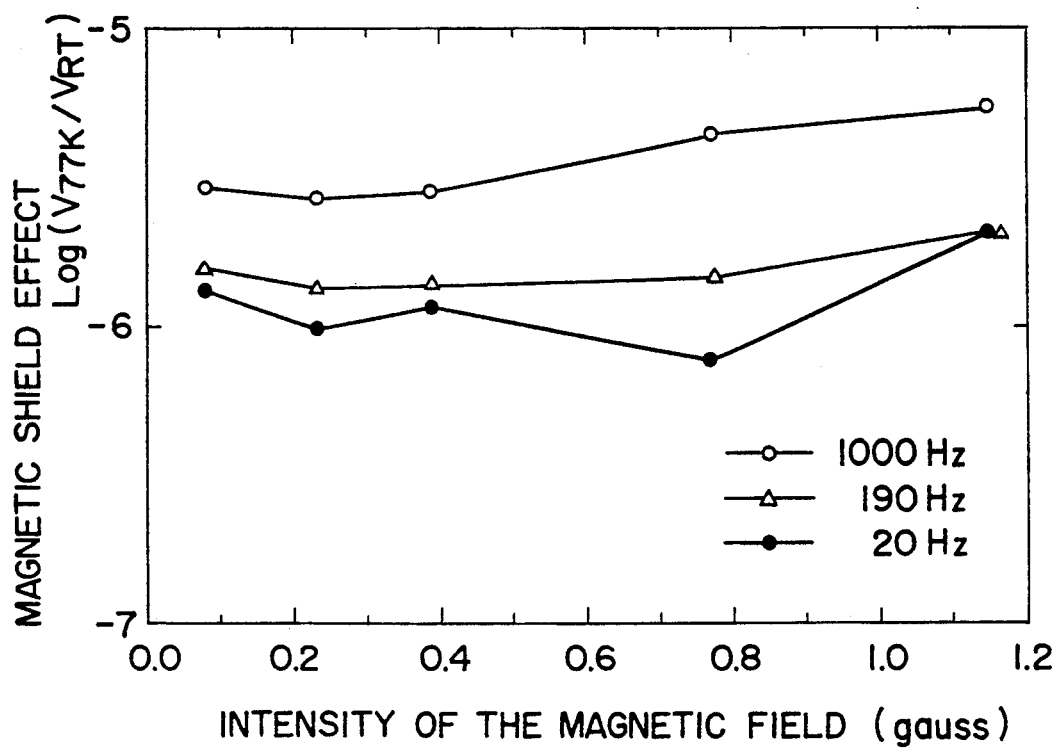
FIG. 5 is a graph showing a magnetic shielding effect measured by the measurement system of FIG. 3.

The result of the magnetic shielding effect measured by a measurement system in FIG. 3 is shown in FIG. 5. The magnetic shielding effect of $1 \times 10^{-5}$ or less was confirmed in a measured frequency range of 10 to 1000 Hz. In $V_{77K}/V_{RT}$, V indicates an induction voltage excited in the detecting coil to be proportional to the intensity of the magnetic field. Since the vessel is not in a superconducting state at the ambient temperature (RT), this ratio can be reread as being the ratio of the presence of the superconducting vessel to the absence of the superconducting vessel.

EXAMPLE 2

Powder of a composition of $Bi_{1.8}Pb_{0.4}Sr_2Ca_2Cu_3O_y$ was produced by an oxalic acid-ethanol coprecipitating process as described in Example 1.

Then, the powder was cold hydrostatically pressed to mold a cylindrical vessel. The pressing pressure was 1.5 tons/cm$^2$, the diameter of a core was 400 mm, the diameter of the opening of the molded piece was 400 mm, the length was 350 mm (bore/length = 1.14), and the thickness was 10 mm.

This molded piece was baked at 845° C. for 20 hours, and sintered. In the case of the Bi oxide superconductor, almost no shrinkage upon baking was confirmed.

In order to check whether the manufactured vessel was cracked or not at the time of manufacturing, it was observed via an X-ray transmission photograph. As a result, it is confirmed that no crack occurred.

Figure 4:
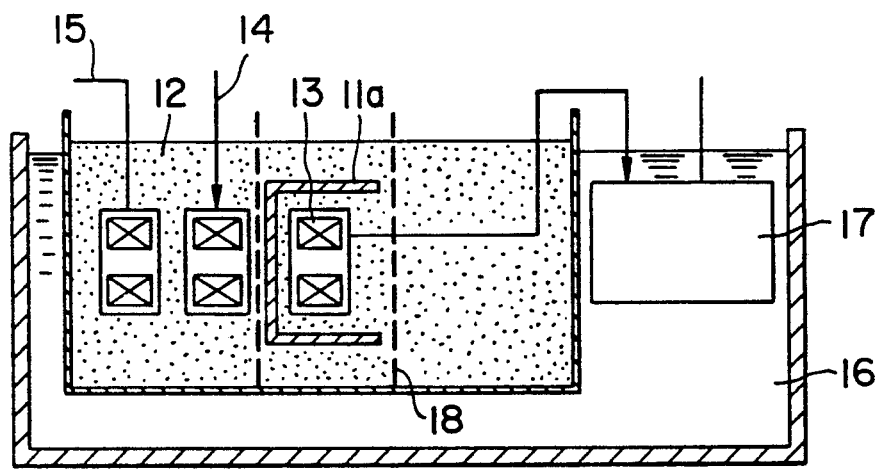
FIG. 4 is a schematic explanatory view showing a measurement system using a magnetic shield of another embodiment according to the invention.

Then, a Mumetal cylinder having 400 mm of diameter and 740 mm of length was manufactured. The thickness was set to 0.5 mm. These vessels are disposed as shown in FIG. 4.

The cylinder was constructed the same as above FIG. 3 except that a superconducting magnetic shield 11a is disposed and a Mumetal cylinder 18 are provided. Similarly to the Example 1, the exciting voltage was measured. As a result, the ratio of the voltage induced in the reference coil in a state that the liquid nitrogen is not poured to the voltage induced in the detecting coil was up to $10^{-9}$ in frequency of 20 H. This represents the shielding effect by the cylinder. A further large shielding effect can be expected by forming the Mumetal cylinder double.

Then, liquid nitrogen was poured to cool it at the ratio of average 20° C./hr. When the superconductor vessel is set to a superconducting state, the above measurement was conducted. As a result, the shielding effect of 20 Hz of frequency was $V_{77K}/V_{RI}$ of up to $1 \times 10^{-5}$.

The measurement was executed in an aluminum electromagnetic shielding room.

EXAMPLE 3

In the Example 2, the case that Helmholz coils are disposed instead of the Mumetal will be described.

The coils are designed as below.

With a coil constant $C$ (=0.716/R)N, R: radius, N: number of turns), when $R = 0.4$ m and $N = 10$, a current value to be supplied by using equations of $C=18Im^{-1}J$, $H = CiIA/mJ$ is:

$I = (0.3 \times 10^3/4\pi)/18 = 1.3$ A and a current density to be supplied is up to 1 A/mm². Therefore, the radius r of a copper wire to be employed is:

$$r = \sqrt{1.3}/\pi = 0.64 \text{ mm}$$

Thus, a current of 1 A/mm² was supplied to cancel the magnetic field of the earth of 0.3 gauss.

In this case, the obtained magnetic shielding effect was up to $1 \times 10^{-5}$. The measurement was performed in an aluminum electromagnetic wave shielding room.

According to the present invention, the influence of the magnetic field of the earth and magnetic noise is small with the magnetic shield of the bismuth high temperature oxide superconductor having the shape and dimensions described above, and extremely weak magnetoencephalographic waves can be preferably measured by the SQUID fluxmeter.

Even if the ratio of the bore/length of the superconducting magnetic shield is set to 1 or more, when the ferromagnetic material magnetic shield or the Helmholz coil is disposed outside the superconducting magnetic shield, the influence of the magnetic field of the earth or the magnetic noise is reduced and a biomagnetism such as a magnetoencephalographic wave can be preferably measured.

Even if the effective superconducting magnetic shield has 1 or less or more of the ratio of bore/length as described above, the superconducting magnetic shield can be manufactured advantageously in ordinary manufacturing process having the steps of pulverizing to powder, molding and sintering.

The present invention is not only effective for the detection, measurements of the biomagnetism as described above, but also can be used to effectively protect a Josephson element, IC circuits against external magnetic noises.

Further, the present invention is applicable not only in the magnetic field of an alternating current but also in that of a direct current.

What is claimed is:

1. A superconducting magnetic shield comprising a bismuth high temperature oxide superconductor having a cylindrical parallelepiped shape opened at one end thereof and having a magnetic shielding effect of $1 \times 10^{-5}$ or less as defined by the ratio of an intensity of a magnetic field at 77 K detected by a magnetic field detecting coil installed in said cylindrical parallelepiped shield to an intensity of a magnetic field at an ambient temperature when the ratio of bore/length is less than 1 and an external alternating magnetic field is objective, said superconducting magnetic shield having a bore/length ratio less than 1.

2. The superconducting magnetic shield according to claim 1, wherein said bismuth high temperature oxide comprises a composition of $Bi_{1.8}Pb_{0.4}Sr_2Ca_2Cu_3O_y$.

* * * * *